(12) United States Patent
Ohi et al.

(10) Patent No.: US 6,198,184 B1
(45) Date of Patent: Mar. 6, 2001

(54) BRUSHLESS MOTOR

(75) Inventors: Shinichi Ohi; Hiroshi Ohsawa; Kazuyoshi Horiuchi; Kouji Ando, all of Konan (JP)

(73) Assignee: Zexel Corporation, Tokyo (JP)

( * ) Notice: Subject to any disclaimer, the term of this patent is extended or adjusted under 35 U.S.C. 154(b) by 0 days.

(21) Appl. No.: 09/003,804

(22) Filed: Jan. 7, 1998

(30) Foreign Application Priority Data

Jan. 10, 1997 (JP) .................................................... 9-014492

(51) Int. Cl.[7] ............................. H01H 37/76; H02K 3/50
(52) U.S. Cl. ............................... 310/68 C; 310/DIG. 6; 337/169
(58) Field of Search ............................... 310/67 R, 68 R, 310/68 C, DIG. 6; 337/169, 163, 165; 361/106

(56) References Cited

U.S. PATENT DOCUMENTS

| | | | |
|---|---|---|---|
| 3,693,047 | * 9/1972 | Hamstra | 318/472 |
| 3,763,454 | * 10/1973 | Zandonatti | 337/404 |
| 4,812,723 | * 3/1989 | Shimizu | 318/488 |
| 4,834,202 | * 5/1989 | Shimizu | 180/79.1 |
| 4,982,143 | * 1/1991 | Gerschner et al. | 318/471 |
| 5,311,060 | * 5/1994 | Rostoker et al. | 361/714 |
| 5,592,353 | * 1/1997 | Shinohara et al. | 361/63 |
| 6,037,726 | * 3/2000 | Tabata et al. | 318/139 |
| 6,054,818 | * 4/2000 | Tabata et al. | 318/139 |

FOREIGN PATENT DOCUMENTS 195 21 557 * 12/1995 (DE) .

* cited by examiner

Primary Examiner—Karl Tamai
(74) Attorney, Agent, or Firm—Wenderoth, Lind & Ponack, L.L.P.

(57) ABSTRACT

In order to protect a brushless motor, heat generated at a switching device, in response to an abnormality, activates a protection device. The protection device includes a connecting line communicating between a source supply line and the switching device. The protection device is provided near the switching device such that it can sense heat at the switching device with a high degree of sensitivity. Thus, when excessive heat is generated at the switching device, the protection device reaches a specific temperature, whereby the source supply line becomes cut off from the switching device, thereby immediately stopping the operation of the brushless motor.

8 Claims, 3 Drawing Sheets

BRUSHLESS MOTOR

BACKGROUND OF THE INVENTION

The present invention relates to a brushless motor that is mainly used in an air blower in an air conditioning system for vehicles.

Brushless motors in the prior, art include the one disclosed in Japanese Unexamined Utility Model Publication No. H2-139473. This brushless motor is provided with a rotor having a field magnet, a stator that generates a rotating magnetic field for the rotor, and a means for exciting the stator. Thus, in this brushless motor, a rotating magnetic field is generated by sequentially exciting a plurality of curved end portions arranged on the stator in a radial direction. The rotor is caused to rotate by the magnet provided on the rotor being repeatedly attracted and repulsed relative to the rotating magnetic field.

In this brushless motor, the means for exciting includes exciting coils that are wound around the stator core, and a means for switching the direction of the current running through the exciting coils. A plurality of field effect transistors (FETS) are normally used as the means for switching. These FETs control the direction of the current running to the exciting coils by controlling signals applied to the gate terminals of the individual FETs. Since a relatively large current runs through the exciting coils, a great quantity of heat is generated, normally reaching up to approximately 150° C., which necessitates that a heat radiator to be provided at each FET.

However, if a problem occurs in the brushless motor itself, e.g. an abnormality in the rotation rate, a circuit error or the like caused by excessive load, it is necessary to protect other normally operating portions from the problem. In particular, it is necessary to cut off communication between the source supply line and the exciting coils to stop the supply of power to the exciting coils so that the rotation of the brushless motor stops.

SUMMARY OF THE INVENTION

An object of the present invention is to provide a brushless motor having a means for protection that protects the brushless motor by causing the means for switching to be cut off from the source supply line when heat is generated in a circuit due to an error and, in particular, when heat is generated at a field effect transistor, a power transistor or the like that is used as the means for switching.

Accordingly, the brushless motor according to the present invention comprises a rotating shaft, a rotor secured to the rotating shaft, a plurality of magnets provided at an internal circumferential surface of the rotor, a stator that generates a rotating magnetic field for the magnets, and exciting coil wound around the stator, a control circuit board having a plurality of means for switching the direction of the current supplied to the exciting coils, and a case housing that stores the control circuit. The brushless motor further comprises a means for protection provided on the control circuit board near the plurality of means for switching, which includes a connecting line between the source supply line and the means for switching, which connecting line melts and disconnects at a specific temperature to cut off the source supply line from the means for switching.

Thus, since the means for protection includes the connecting line that communicates between the source supply line and the means for switching, and is provided near the means for switching, the means for protection can sense heat generated at the means for switching with a high degree of sensitivity. Consequently, if the means for switching generates heat at or exceeding a specific level, causing the means for protection to become heated to a specific level, the communication between the source supply line and the means for switching is cut off, immediately stopping the operation of the brushless motor to achieve the object described above.

Moreover, according to the present invention, the case housing comprises a first case through which the rotating shaft passes, with the rotor and the stator mounted externally thereto. The control circuit board is mounted in the first case, and the means for heat discharge is located at the means for switching. The case housing further comprises a second case that interlocks with the first case to cover the control circuit board from below. The means for protection is provided on the control circuit board in the vicinity of the means for heat discharge and the means for switching, and extends toward the second case.

Thus, since the means for protection extends toward the second case, and is located on the control circuit board, the maintenance on the means for protection can be performed easily by simply removing the second case after the circuit is shut down by the means for protection.

Furthermore, according to the present invention, the means for protection includes a plate which is formed from an elastic conductive material and, in an elastically deformed state, the plate is fixed at its two ends to the source supply line and the side of the means for switching through solder that melts at a specific temperature.

Thus, when the solder is melted by the het generated at the means for switching, the plate cuts off communication between the source supply line and the means for switching due to the restoring force of the plate, thereby achieving the object described above. The plate is formed of a copper ally having a specific elastic coefficient, and it is desirable to use solder that melts within the range of approximately 160°~180° C.

Moreover, the means for switching is only required to be capable of turning on off the current by a specific signal. Normally, power transistors or field effect transistors are employed as the means for switching. It is particularly desirable to use field effect transistors. In addition, the means for heat discharge is a heat radiator of aluminum or an aluminum alloy to which the field effect transistors are bonded via silicon oil, and is provided in the vicinity of the rotating range of the fan located at the first case and is exposed to the outside from the first case.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings, which illustrate a preferred embodiment. In the drawings.

DETAILED DESCRIPTION OF THE PREFERRED EMBODIMENT

The following is an explanation of the preferred embodiment of the present invention in reference to the drawings.

Figure 1:
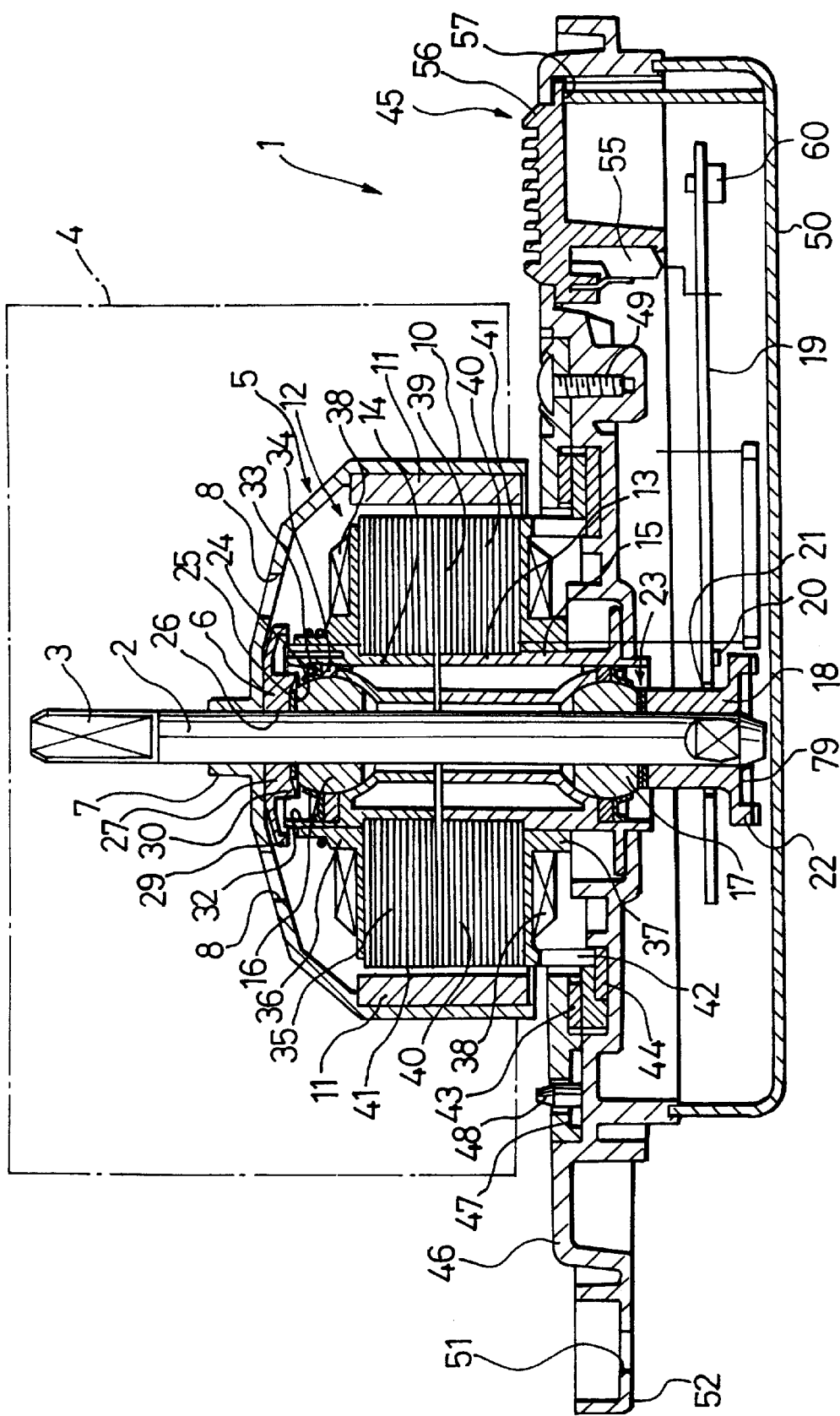
FIG. 1 is a cross section of the brushless motor in an embodiment of the present invention.

A brushless motor 1 in FIG. 1 may be employed, for instance, in an air blower in an air conditioning system for vehicles. This motor comprises a rotating shaft 2 to which a sirocco type fan is secured, a rotor 5 which is secured to the rotating shaft 2, a stator 12 that generates a rotating magnetic field for the rotor 5, a control circuit board 19 including an excitation circuit that supplies an exciting current to the stator 12, and a case housing 45 that stores the control circuit board 19.

The case housing 45 includes an upper case member 46, a lower case member 50, and a lid body 47. The control circuit board 19 is located within case housing 45. Provided at the upper case member 46 is a mounting portion 52 having a screw hole 51 for mounting of the brushless motor 1, and an opening portion 57 through which a heat radiator 56 to which a plurality of field effect transistors (FETs) 55 are secured. These FETs 55 constitute switch devices or means for switching the direction of a current. A first case includes the upper case member 46 and the lid body 47, and a second case is the lower case member 50.

The rotating shaft 2 is rotatably held by bearings 16 and 17. The bearings 16 and 17 are secured to upper and lower bearing holders 14 and 15 via a bearing stopper 33 together with a felt 34 that contains lubricating oil and is in contact with the bearings 16 and 17. The bearing holders 14 and 15 are mounted within a through hole 13 of the stator. In addition, a sensor magnet 18 that indicates the positions of permanent magnets 11 of the rotor 5 is press-fitted to the lower end of the rotating shaft 2. With the sensor magnet 18 held in the axial direction of the rotating shaft 2 by a push-nut 79, the distance between the sensor magnet 18 and a plurality of Hall elements 20 mounted to the control circuit board 19 is maintained constant.

The sensor magnet 18 is mounted to the rotating shaft 2 by passing the sensor magnet 18 through an opening 21 formed in the control circuit board 19. A flange portion 22, which is formed at an end of the sensor magnet 18, extends in a radial direction under the control circuit board 19. The plurality of the Hall elements 20 are provided at the rear side of the control circuit board 19 and face the flange-portion. These Hall elements 20 accurately detect the positions of the permanent magnets 11 by detecting the magnetism of the sensor magnet 18. And, a rotating magnetic field is generated at the stator 12 by means of the excitation circuit provided on the control circuit board 19 based upon he results of the detection. Provided between the sensor magnet 18 and the bearing 17, is a washer group 23 comprising a plurality of washers to reduce the sling resistance between the sensor magnet 18 and the bearing.

The rotating shaft 2 is provided at its upper end with an interlocking end portion 3 for securing the fan 4, and the rotor 5 is secured to the shaft below the interlocking end portion 3. The rotor 5 includes a hub portion 7 which is press-fitted and secured to the rotating shaft 2, an umbrella portion 9 that expands from the hub portion 7 and is provided with a plurality of ventilation holes 8, a cylindrical portion 10 which extends downwardly from the outermost circumferential edge of the umbrella portion 9, and a plurality of magnets 11 that are provided at the internal circumferential side surface of the cylindrical portion 10.

The sliding resistance at a dust stopper 6, which holds the rotor 5 in the axial direction, is reduced with a nylon-based washer 24 and a washer 25 of NBR rubber that are provided between the thrust stopper 6 and the bearing 16. The thrust stopper 6 includes a cylindrical portion 27 having a through hold 26 through which the rotating shaft 2 is inserted, and a circumferential wall 29 that extends from the upper end of the cylindrical portion 27 in the radial direction along the umbrella portion 9 and extends downwardly outwardly from the circumferential edge of the cylindrical portion 27 over a specific width. Furthermore, at the lower level end surface of the cylindrical portion 27 an oil guide 30 is formed which gradually slopes downwardly and radially outwardly from the sliding contact surface between the cylindrical portion 27 and the washer 25.

An upper end portion 32 of the bearing holder 14 is positioned in a space formed between the oil guide 30 and the circumferential wall 29 so that the lubricating oil dripping from oil guide 30 is reliably returned to the felt 34, and so that dust particles from the outside are prevented from adhering to the bearing 16.

Figure 2:
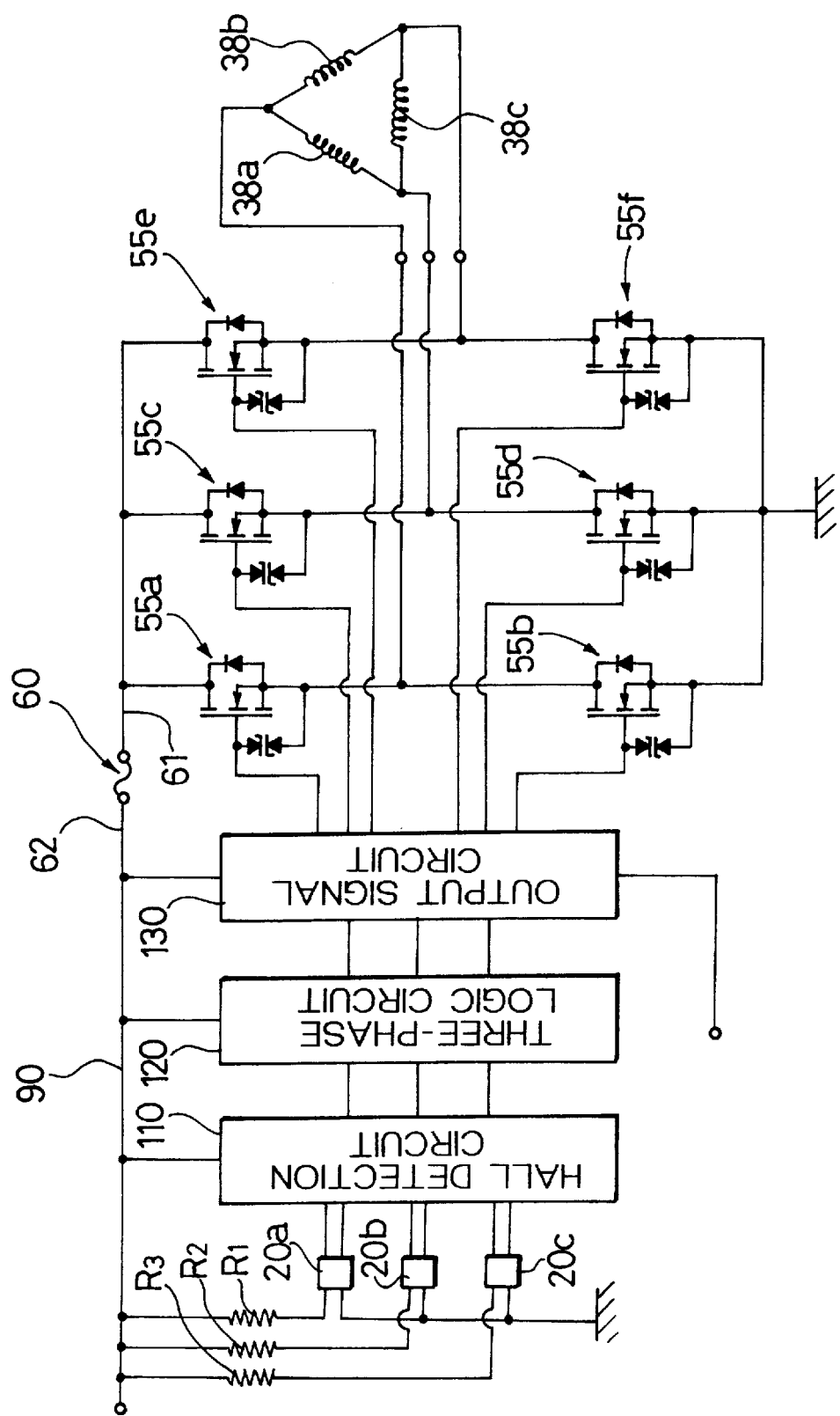
FIG. 2 is a schematic block diagram of the excitation circuit of the brushless motor in the embodiment of the present invention.

The stator 12 comprises a stator core 35 which is formed by laminating silicon steel plates. Upper and lower insulating covers 36 and 37 are mounted to clamp the stator core 35 from above and below, and exciting coils 38 are wound around the stator core 35. The stator core is insulated by upper and lower insulating covers 36 and 37. The stator core 35 is provided with the through hole 13 at its center, within which the bearing holders 14 and 15 are mounted. Coil winding portions 40 extend in six directions from a circumferential wall 39 of the through hole 13. Arch-shaped magnetic pole portions 41 that face the permanent magnets 11 of the rotor 5 are formed at the front end of the coil winding portions 40. In this embodiment, the exciting coils 38 (38a~38c) are delta-connected as shown in FIG.2.

Additionally, the lower insulating cover 37 is provided with leg portions 42 extending in six directions, the front ends of which are clamped by elastic members 43 and 44 and secured between the upper case member 46 and the lid body 47. Thus, the stator 12 is secured to the case housing 45, with the shaft 2 rotatable relative there. The lid body 47 is positioned by a pin 48 and is secured to the upper case member 46 with a screw 49.

The excitation circuit provided on the control circuit board 19 in the brushless motor as described above may have the arrangement as shown in FIG. 2. This excitation circuit comprises a Hall detection circuit 110 that detects the positions of the permanent magnets 11 at the rotor 5 as detected by the Hall elements 20 (20a, 20b and 20c). The circuit also comprises a three-phase logic circuit 120 that determines the direction of the rotating magnetic field relative to the position of the Hall detection circuit 110, and selects a current supply pattern that will achieve the desired direction of the rotatating magnetic field. Also included is an output signal circuit 130 that outputs gate signals to the individuals FETs 55 (55a~55f), i.e. switch devices, and uses the signal output from the three-phase logic circuit 120 along with an output pulse signal set by a rotation rate setting signal and the FETs 55 (55a~55f). Accordingly, the FETs 55a~55f at specific positions are sequentially turned on or off and the direction of the current supplied to the exciting coils 33a~38c is switched to generate a rotating magnetic field at the stator 12, thereby causing the rotor 5 to rotate together with the rotating magnetic field. Between a source-side wiring pattern 62 connected to the source supply line 90, and a FET-side wiring pattern 61 connected to the FETs 55a~55f, a protection mechanism or device 60 is provided. R1, R2 and R3 indicate voltage dividing resistors at the Hall elements 20a~20c.

Figure 3:
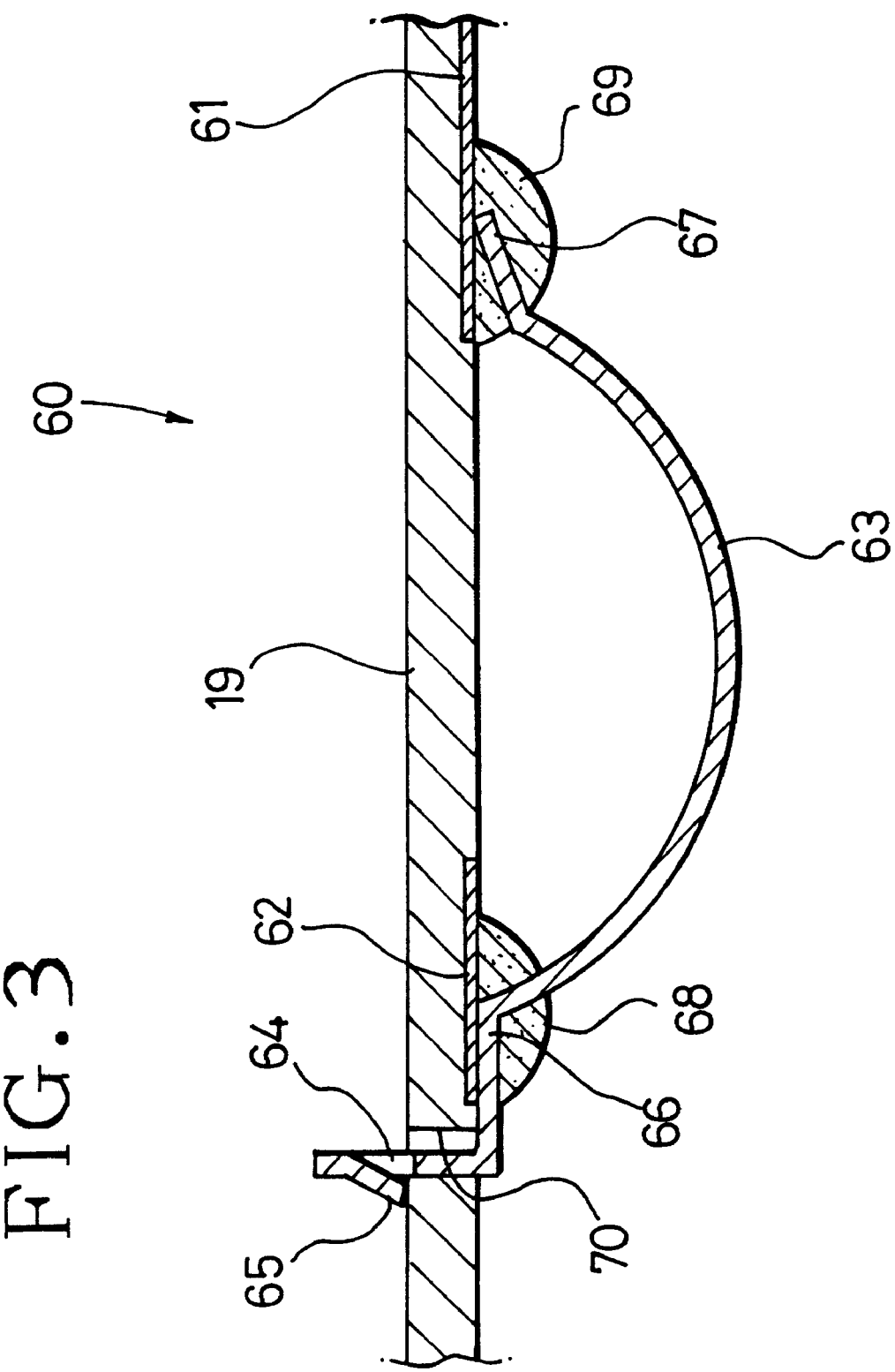
FIG. 3 shows an example of the protection mechanism in the embodiment of the present invention.

This protection mechanism 60 is mounted in the vicinity of the FETs 55 to the control circuit board 19 and extends toward the lower case member 50. As shown in FIG. 3, this protection mechanism 60 comprises a supporting portion 64 that is inserted through a hole 70 in the control circuit board 19. It further comprises a springup-side terminal portion 67 that contacts the FET-side wiring pattern 61 connected to the FETs 55 (55~a~55f). Also included is a fixed-side terminal portion 66 that contacts the source-side wiring pattern 62 connected to the source supply line, and an elastic deforming portion 63 that connects the springup-side terminal portion 67 to the fixed-side terminal portion 66. A retaining portion 65 is formed at the supporting portion 64. In this protection mechanism 60, the springup-side terminal portion 67 and the FET-side wiring pattern 61 press against the elastic deforming portion 63 to cause it to become elastically deformed, with the springup-side terminal portion 67 soldered to the FET-side wiring pattern 61. Likewise, the fixed-side terminal portion 66 is soldered to the source-side wiring pattern 62. Reference numbers 68 and 69 indicate solder which melts at a temperature in the range of, for instance, 160° C. through 180° C.

With the protection mechanism 60 if the FETs 55 generate heat at or exceeding a specific level, this heat is communicated through the FET-side wiring pattern 61 and melts the solder 69. Because of this melting, the springup-side terminal portion 67 springs up due to the restoring force of the elastic deforming portion 63, and thereby isolates the source-side wiring pattern 62 from the FET-side wiring pattern 61. Thus, since the circuit extending to the exciting coils 38 via the FETs 55 is cut off from the source supply line 90, the drive of the brushless motor 1 stops, achieving protection of portions operating normally. In addition, since the protection mechanism 60 is provided inside the case housing 45, the solder melts when the temperature inside the case housing 45 reaches a level equal to or exceeding a specific level, thereby making it possible to achieve protection against a high temperature equal to or exceeding the specific level occurring due to some other cause.

As has been explained, since the means for protection is capable of shutting down the circuit depending upon the temperature, protection is achieved if the circuit portion is heated to a level equal to or exceeding a specific level and/or if the mechanical portion is heated to a level equal to or exceeding a specific level, thereby protecting both the mechanical portion and the circuit portion.

In addition, since the means for protection is provided on the control circuit board and extends toward the second case, maintenance can be performed with ease by simply removing the second case, thereby facilitating repair work required after eliminating the cause of an abnormality.

What is claimed is:

1. A motor, comprising:

a rotary shaft;

a rotor secured to said rotary shaft;

a stator positioned between said rotary shaft and said rotor;

a plurality of coils wound around said stator;

a plurality of magnets secured to an inner circumferential surface of said rotor and opposed to said plurality of coils for generating a magnetic field to cause rotation of said rotor relative to said stator;

a drive circuit including at least one switch device to switch a direction of current supplied to said coils, and a source supply line electrically connected to said at least one switch device;

a circuit board supporting said drive circuit, and a housing, wherein said circuit board is contained within said housing;

a protection device including an arch-shaped resilient plate of an electrically conductive material electrically interconnecting said source supply line with said at least one switch device via a solder material that melts at a specific temperature in response to heat generated at said at least one switch device to break said drive circuit by breaking the electrical connection between said source supply line and said at least one switch device, with one end of said arch-shaped resilient plate being electrically connected to a first portion of said drive circuit and a second end of said arch-shaped resilient plate being electrically connected to a second portion of said drive circuit such that said arch-shaped resilient plate electrically interconnects said source supply line with said at least one switch device, and wherein a portion of said second end of said arch-shaped resilient plate passes through an opening in said circuit board such that said second end is mechanically attached to said circuit board; and a heat radiator to transfer heat from said at least one switch device, wherein said protection device is located adjacent to said heat radiator.

2. The motor of claim 1, wherein said electrically conductive material comprises a copper alloy.

3. The motor of claim 2, wherein said heat radiator is in contact with said at least one switch device, and extends away from said housing.

4. The motor of claim 3, wherein said heat radiator comprises an aluminum alloy.

5. The motor of claim 2, wherein said at least one switch device includes a plurality of field effect transistors.

6. The motor of claim 5, wherein said heat radiator is in contact with said plurality of field effect transistors.

7. The motor of claim 6, wherein said heat radiator comprises an aluminum alloy.

8. The motor of claim 7, wherein said heat radiator is in contact with said plurality of field effect transistors via a silicon oil.

* * * * *